US012628402B2

(12) United States Patent
Tsai

(10) Patent No.: US 12,628,402 B2
(45) Date of Patent: May 12, 2026

(54) SEMICONDUCTOR DEVICE WITH SPACER AND METHOD FOR FABRICATING THE SAME

(71) Applicant: NANYA TECHNOLOGY CORPORATION, New Taipei City (TW)

(72) Inventor: Jhen-Yu Tsai, Kaohsiung City (TW)

(73) Assignee: NANYA TECHNOLOGY CORPORATION, New Taipei City (TW)

( * ) Notice: Subject to any disclaimer, the term of this patent is extended or adjusted under 35 U.S.C. 154(b) by 455 days.

(21) Appl. No.: 18/382,688

(22) Filed: Oct. 23, 2023

(65) Prior Publication Data

US 2025/0015164 A1 Jan. 9, 2025

Related U.S. Application Data

(62) Division of application No. 18/219,238, filed on Jul. 7, 2023.

(51) Int. Cl.
| | |
|---|---|
| *H10D 64/01* | (2025.01) |
| *H10B 12/00* | (2023.01) |
| *H10D 64/66* | (2025.01) |

(52) U.S. Cl.
CPC ......... *H10D 64/021* (2025.01); *H10B 12/053* (2023.02); *H10B 12/488* (2023.02); *H10D 64/665* (2025.01)

(58) Field of Classification Search
CPC .. H10B 12/488; H10B 12/482; H10B 12/053; H10B 12/34; H10D 64/513; H10D 64/021; H10D 64/665; H10D 64/671
See application file for complete search history.

(56) References Cited

U.S. PATENT DOCUMENTS

| | | | | |
|---|---|---|---|---|
| 2021/0296237 A1* | 9/2021 | Kim | ...................... | H10B 12/315 |
| 2023/0164982 A1* | 5/2023 | Kim | .................... | H10B 12/0335 |
| | | | | 257/296 |
| 2023/0253318 A1* | 8/2023 | Lee | ...................... | H10B 12/485 |
| | | | | 257/213 |

FOREIGN PATENT DOCUMENTS

TW 202205376 A 2/2022

OTHER PUBLICATIONS

Office Action and and the search report mailed on Mar. 18, 2024 related to Taiwanese Application No. 112129902.
Office Action and and the search report mailed on Aug. 14, 2024 related to Taiwanese Application No. 113112833.

* cited by examiner

*Primary Examiner* — Britt Hanley
*Assistant Examiner* — Jason James Greaving
(74) *Attorney, Agent, or Firm* — Xuan Zhang

(57) ABSTRACT

The present application discloses a semiconductor device and a method for fabricating the semiconductor device. The semiconductor device includes a substrate; a buried conductive layer including a bottom portion positioned in the substrate, and a top portion positioned in the substrate and positioned on the bottom portion; and an in-recess spacer positioned in the substrate, surrounding the bottom portion, and covered by the top portion. A top surface of the top portion and a top surface of the substrate are substantially coplanar. A bottom surface of the in-recess spacer and a bottom surface of the bottom portion are substantially coplanar. A sidewall of the in-recess spacer and a sidewall of the top portion are substantially coplanar.

18 Claims, 33 Drawing Sheets

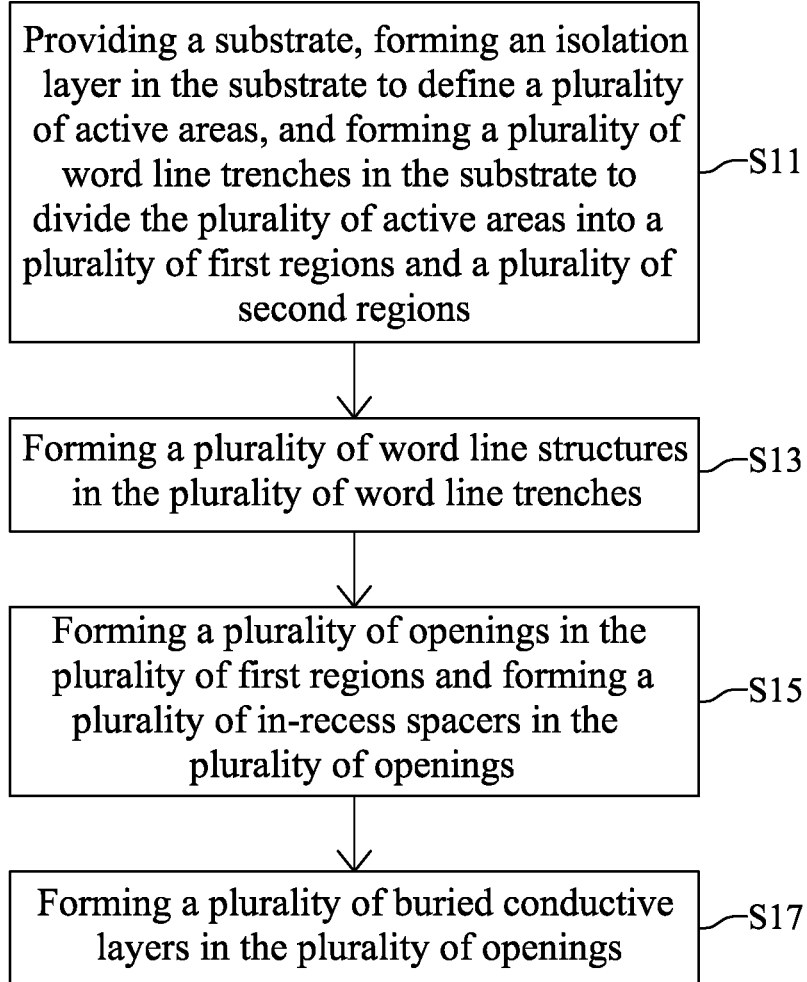

10

Providing a substrate, forming an isolation layer in the substrate to define a plurality of active areas, and forming a plurality of word line trenches in the substrate to divide the plurality of active areas into a plurality of first regions and a plurality of second regions ⌐S11

Forming a plurality of word line structures in the plurality of word line trenches ⌐S13

Forming a plurality of openings in the plurality of first regions and forming a plurality of in-recess spacers in the plurality of openings ⌐S15

Forming a plurality of buried conductive layers in the plurality of openings ⌐S17

FIG. 1

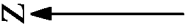
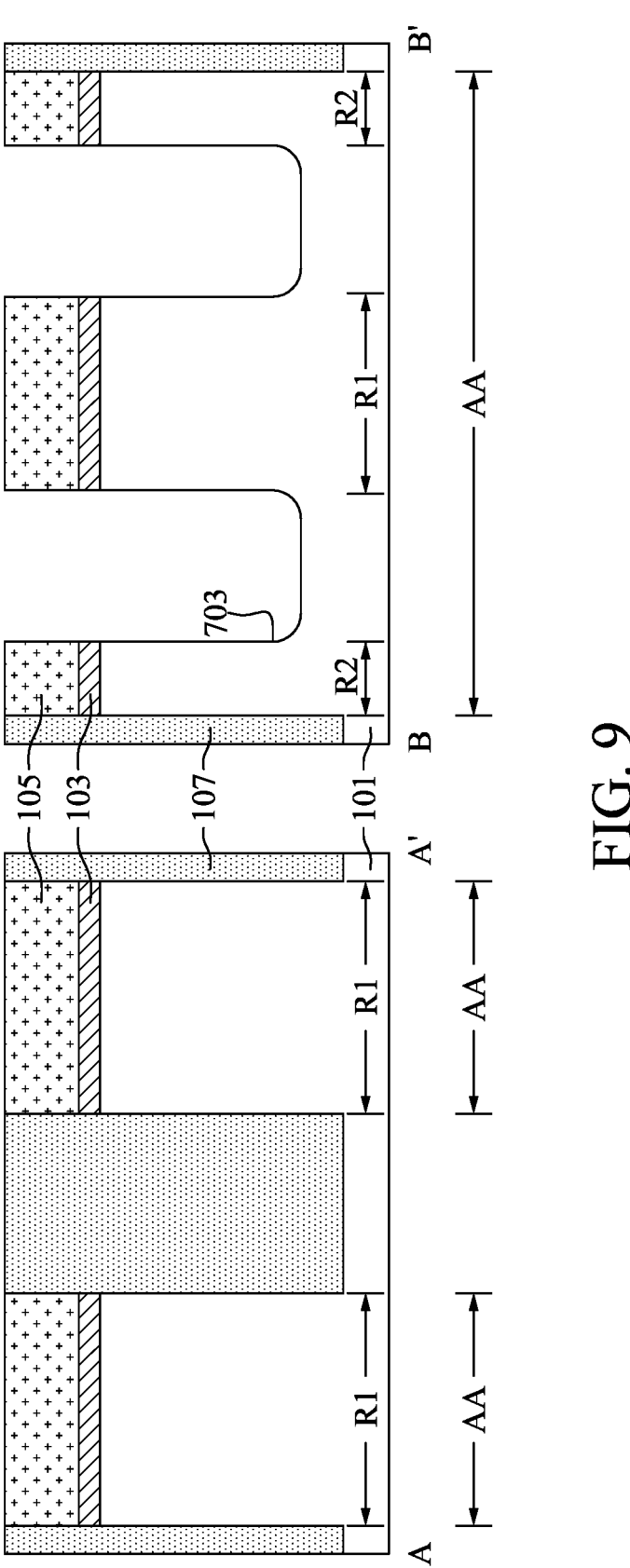
FIG. 9

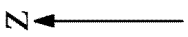
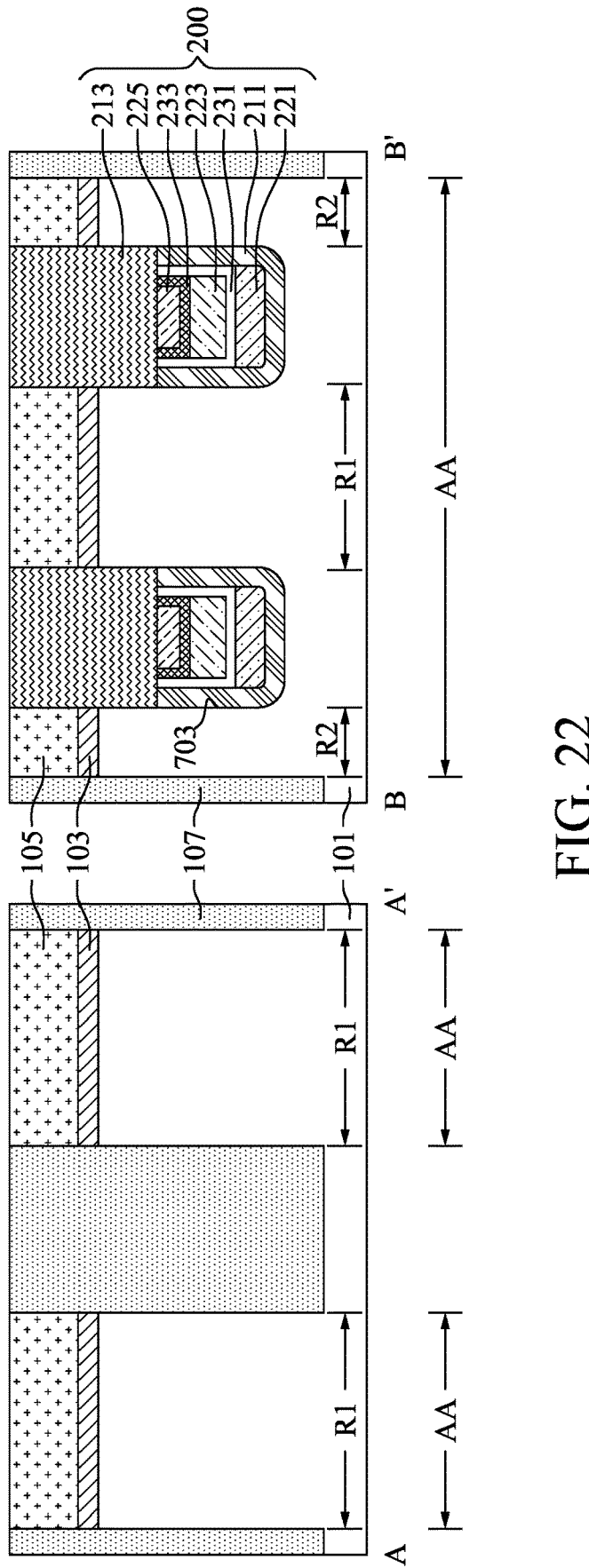
FIG. 22

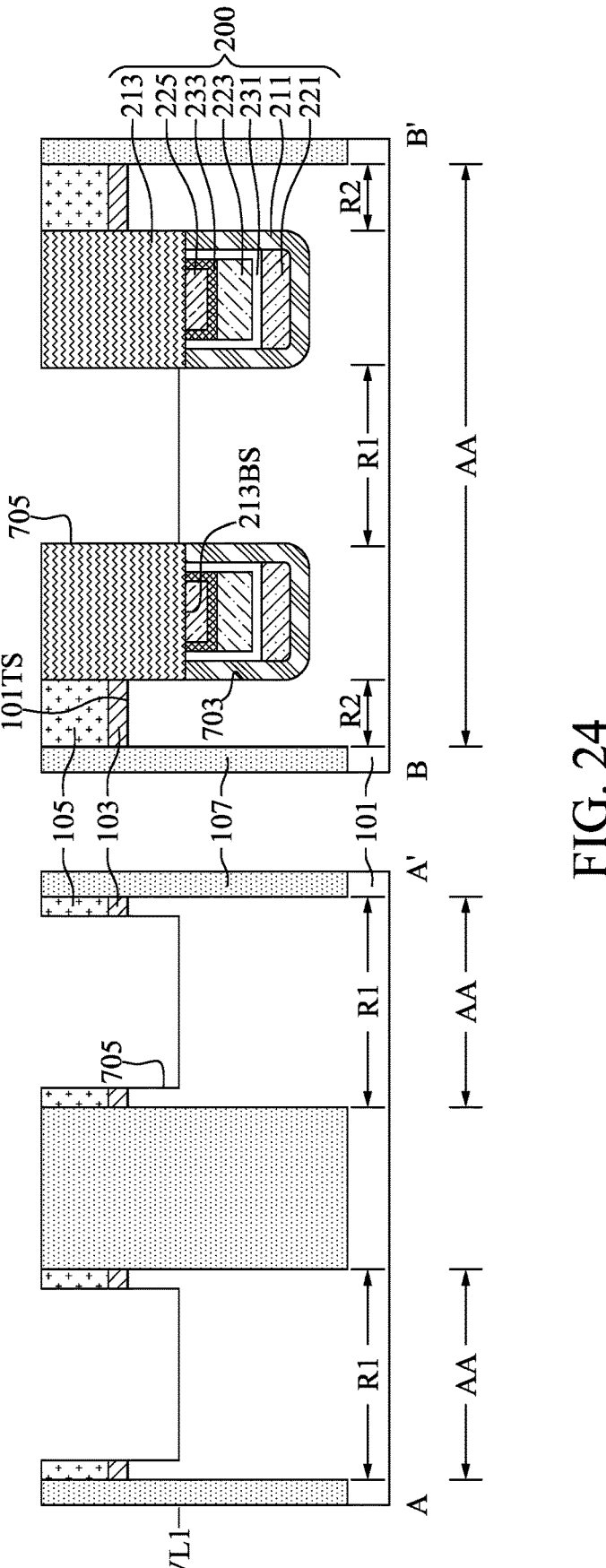
FIG. 24

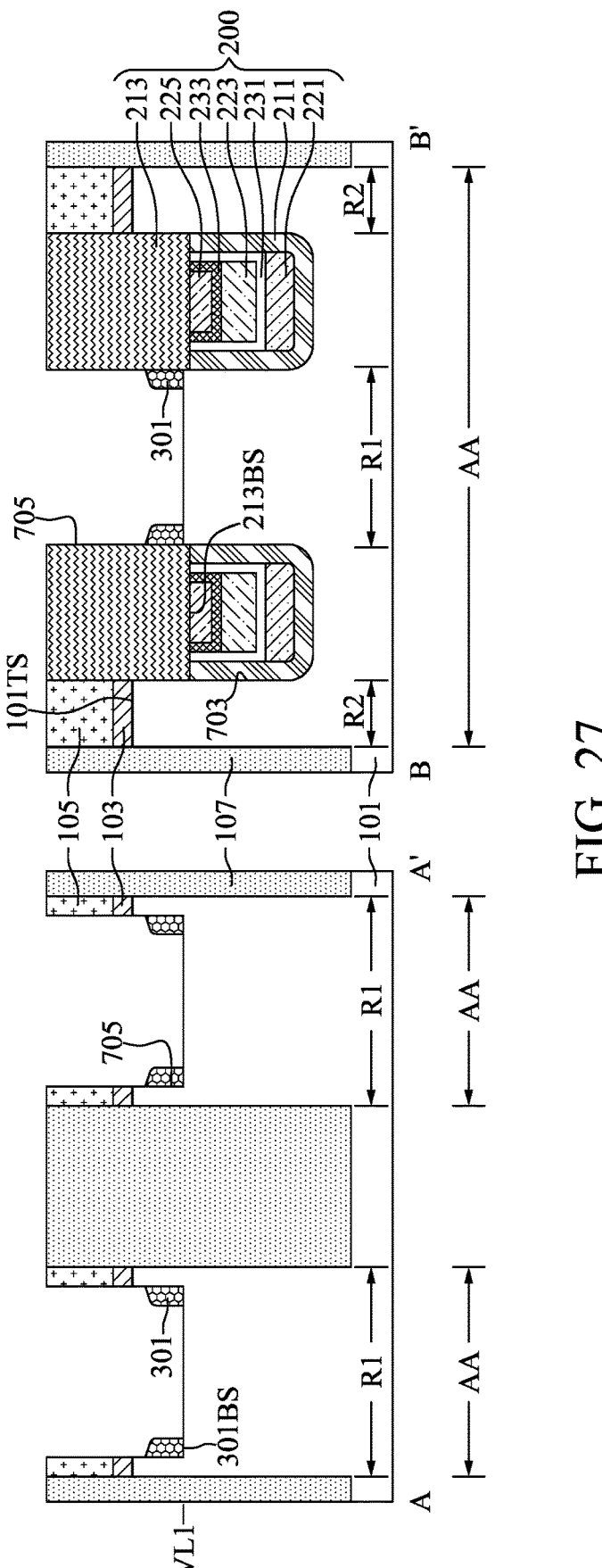
FIG. 27

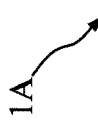
FIG. 31

SEMICONDUCTOR DEVICE WITH SPACER AND METHOD FOR FABRICATING THE SAME

CROSS-REFERENCE TO RELATED APPLICATION

This application is a divisional application of U.S. Non-Provisional application Ser. No. 18/219,238 filed Jul. 7, 2023, which is incorporated herein by reference in its entirety.

TECHNICAL FIELD

The present disclosure relates to a semiconductor device and a method for fabricating the semiconductor device, and more particularly, to a semiconductor device with a spacer and a method for fabricating the semiconductor device with the spacer.

DISCUSSION OF THE BACKGROUND

Semiconductor devices are used in a variety of electronic applications, such as personal computers, cellular telephones, digital cameras, and other electronic equipment. The dimensions of semiconductor devices are continuously being scaled down to meet the increasing demand of computing ability. However, a variety of issues arise during the scaling-down process, and such issues are continuously increasing. Therefore, challenges remain in achieving improved quality, yield, performance, and reliability and reduced complexity.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor device including a substrate; a buried conductive layer including a bottom portion positioned in the substrate, and a top portion positioned in the substrate and positioned on the bottom portion; and an in-recess spacer positioned in the substrate, surrounding the bottom portion, and covered by the top portion. A top surface of the top portion and a top surface of the substrate are substantially coplanar. A bottom surface of the in-recess spacer and a bottom surface of the bottom portion are substantially coplanar. A sidewall of the in-recess spacer and a sidewall of the top portion are substantially coplanar.

Another aspect of the present disclosure provide a semiconductor device including a substrate; a plurality of word line structures positioned in the substrate; a buried conductive layer including a bottom portion positioned in the substrate and between the plurality of word line structures, and a top portion positioned in the substrate, on the bottom portion, and between the plurality of word line structures; and an in-recess spacer positioned in the substrate, between the plurality of word line structures, surrounding the bottom portion, and covered by the top portion. A top surface of the top portion, a top surface of the substrate, and top surfaces of the plurality of word line structures are substantially coplanar. A bottom surface of the in-recess spacer and a bottom surface of the bottom portion are substantially coplanar. A sidewall of the in-recess spacer and a sidewall of the top portion are substantially coplanar.

Another aspect of the present disclosure provides a method for fabricating a semiconductor device including providing a substrate; forming an opening in the substrate; conformally forming a layer of spacer material in the opening; performing a spacer etching process to remove a portion of the spacer material and form an in-recess spacer in the opening; and forming a buried conductive layer in the opening and covering the in-recess spacer.

Due to the design of the semiconductor device of the present disclosure, the electrical field near the buried conductive layer may be reduced by employing the in-recess spacer. Therefore, the gate-induced drain leakage may be reduced due to the electrical field reduction. As a result, the performance of the semiconductor device may be improved.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIG. 1 illustrates, in a flowchart diagram form, a method for fabricating a semiconductor device in accordance with one embodiment of the present disclosure;

FIGS. 9 to 20 are schematic cross-sectional view diagrams taken along lines A-A' and B-B' in FIG. 8 illustrating part of the flow for fabricating the semiconductor device in accordance with one embodiment of the present disclosure;

FIG. 22 is a schematic cross-sectional view diagram taken along lines A-A' and B-B' in FIG. 21;

FIGS. 24 and 25 are schematic cross-sectional view diagrams taken along lines A-A' and B-B' in FIG. 23 illustrating part of the flow for fabricating the semiconductor device in accordance with one embodiment of the present disclosure;

FIGS. 27 and 28 are schematic cross-sectional view diagrams taken along lines A-A' and B-B' in FIG. 26 illustrating part of the flow for fabricating the semiconductor device in accordance with one embodiment of the present disclosure;

FIGS. 30 and 31 are schematic cross-sectional view diagrams taken along lines A-A' and B-B' in FIG. 29 illustrating part of the flow for fabricating the semiconductor device in accordance with one embodiment of the present disclosure;

DETAILED DESCRIPTION

Figure 2:
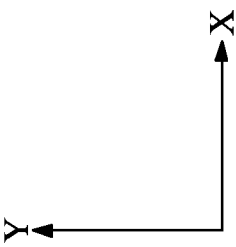
FIG. 2 illustrates, in a schematic top-view diagram, an intermediate semiconductor device in accordance with one embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It should be understood that when an element or layer is referred to as being "connected to" or "coupled to" another element or layer, it can be directly connected to or coupled to another element or layer, or intervening elements or layers may be present.

It should be understood that, although the terms first, second, etc. may be used herein to describe various elements, these elements should not be limited by these terms. Unless indicated otherwise, these terms are only used to distinguish one element from another element. Thus, for example, a first element, a first component or a first section discussed below could be termed a second element, a second component or a second section without departing from the teachings of the present disclosure.

Unless the context indicates otherwise, terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning. For example, items described as "substantially the same," "substantially equal," or "substantially planar," may be exactly the same, equal, or planar, or may be the same, equal, or planar within acceptable variations that may occur, for example, due to manufacturing processes.

In the present disclosure, a semiconductor device generally means a device which can function by utilizing semiconductor characteristics, and an electro-optic device, a light-emitting display device, a semiconductor circuit, and an electronic device are all included in the category of the semiconductor device.

It should be noted that, in the description of the present disclosure, above (or up) corresponds to the direction of the arrow of the direction Z, and below (or down) corresponds to the opposite direction of the arrow of the direction Z.

It should be noted that, in the description of the present disclosure, the terms "forming," "formed" and "form" may mean and include any method of creating, building, patterning, implanting, or depositing an element, a dopant or a material. Examples of forming methods may include, but are not limited to, atomic layer deposition, chemical vapor deposition, physical vapor deposition, sputtering, co-sputtering, spin coating, diffusing, depositing, growing, implantation, photolithography, dry etching, and wet etching.

It should be noted that, in the description of the present disclosure, the functions or steps noted herein may occur in an order different from the order noted in the figures. For example, two figures shown in succession may in fact be executed substantially concurrently or may sometimes be executed in a reversed order, depending upon the functionalities or steps involved.

Figure 3:
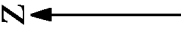
FIG. 3 is a schematic cross-sectional view diagram taken along lines A-A' and B-B' in FIG. 2.
Figure 4:
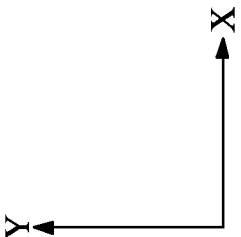
FIG. 4 illustrates, in a schematic top-view diagram, an intermediate semiconductor device in accordance with one embodiment of the present disclosure.
Figure 5:
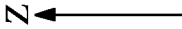
FIG. 5 is a schematic cross-sectional view diagram taken along lines A-A' and B-B' in FIG. 4.
Figure 6:
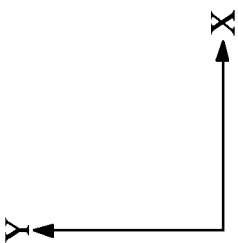
FIG. 6 illustrates, in a schematic top-view diagram, an intermediate semiconductor device in accordance with one embodiment of the present disclosure.

FIG. 1 illustrates, in a flowchart diagram form, a method 10 for fabricating a semiconductor device 1A in accordance with one embodiment of the present disclosure. FIG. 2 illustrates, in a schematic top-view diagram, an intermediate semiconductor device in accordance with one embodiment of the present disclosure. FIG. 3 is a schematic cross-sectional view diagram taken along lines A-A' and B-B' in FIG. 2. FIG. 4 illustrates, in a schematic top-view diagram, an intermediate semiconductor device in accordance with one embodiment of the present disclosure. FIG. 5 is a schematic cross-sectional view diagram taken along lines A-A' and B-B' in FIG. 4. FIG. 6 illustrates, in a schematic top-view diagram, an intermediate semiconductor device in accordance with one embodiment of the present disclosure.

Figure 7:
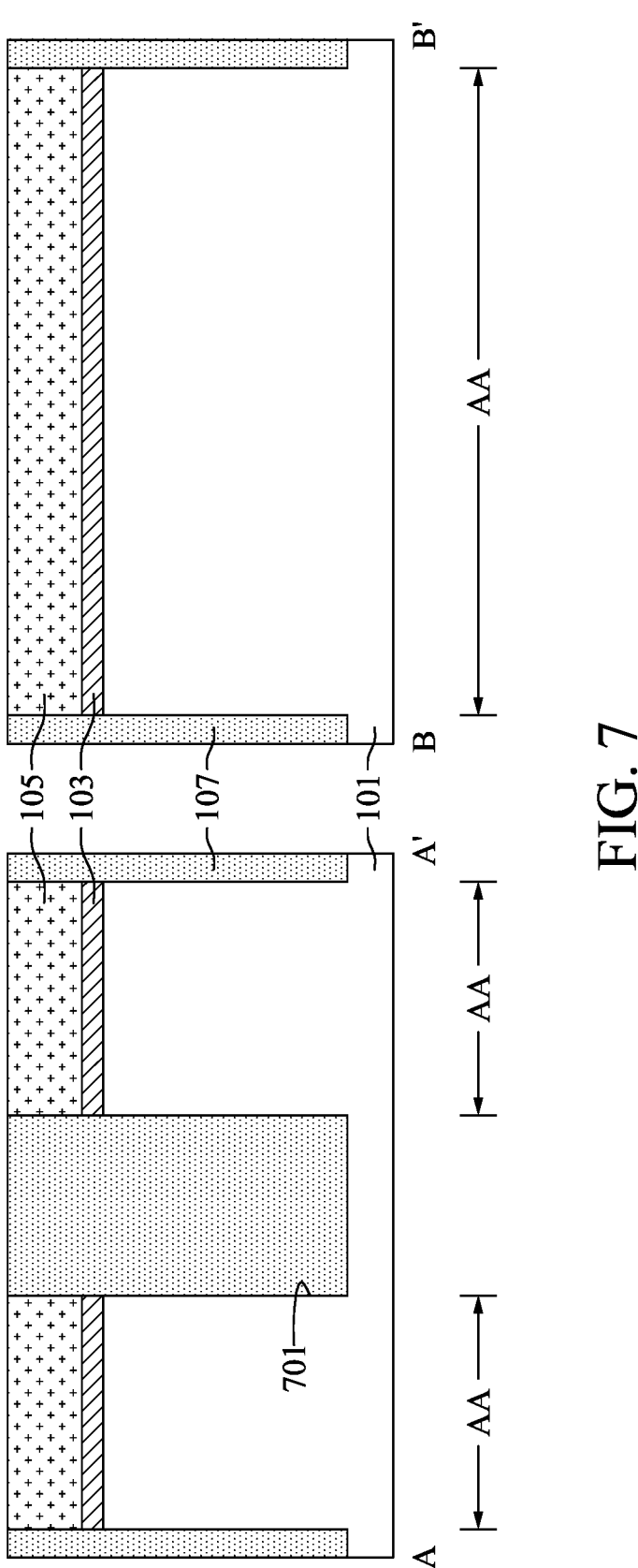
FIG. 7 is a schematic cross-sectional view diagram taken along lines A-A' and B-B' in FIG. 6.
Figure 8:
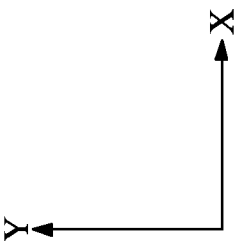
FIG. 8 illustrates, in a schematic top-view diagram, an intermediate semiconductor device in accordance with one embodiment of the present disclosure.

FIG. 7 is a schematic cross-sectional view diagram taken along lines A-A' and B-B' in FIG. 6. FIG. 8 illustrates, in a schematic top-view diagram, an intermediate semiconductor device in accordance with one embodiment of the present disclosure. FIGS. 9 to 20 are schematic cross-sectional view diagrams taken along lines A-A' and B-B' in FIG. 8 illustrating part of the flow for fabricating the semiconductor device 1A in accordance with one embodiment of the present disclosure. FIG. 21 illustrates, in a schematic top-view diagram, an intermediate semiconductor device in accordance with one embodiment of the present disclosure. FIG. 22 is a schematic cross-sectional view diagram taken along lines A-A' and B-B' in FIG. 21.

With reference to FIGS. 1 to 9, at step S11, a substrate 101 may be provided, an isolation layer 107 may be formed in the substrate 101 to define a plurality of active areas AA, and a plurality of word line trenches 703 may be formed in the substrate 101 to divide the plurality of active areas AA into a plurality of first regions R1 and a plurality of second regions R2.

With reference to FIGS. 2 and 3, in some embodiments, the substrate 101 may include a bulk semiconductor substrate that is composed of at least one semiconductor material. The bulk semiconductor substrate may be formed of, for example, an elementary semiconductor, such as silicon or germanium; a compound semiconductor, such as silicon germanium, silicon carbide, gallium arsenide, gallium phosphide, indium phosphide, indium arsenide, indium antimonide, or other III-V compound semiconductor or II-VI compound semiconductor; or combinations thereof.

In some embodiments, the substrate 101 may include a semiconductor-on-insulator structure which consists of, from bottom to top, a handle substrate, an insulator layer, and a topmost semiconductor material layer. The handle substrate and the topmost semiconductor material layer may be formed of the same material as the bulk semiconductor substrate aforementioned. The insulator layer may be a crystalline or non-crystalline dielectric material such as an oxide and/or nitride. For example, the insulator layer may be a dielectric oxide such as silicon oxide. For another example, the insulator layer may be a dielectric nitride such as silicon nitride or boron nitride. For yet another example, the insulator layer may include a stack of a dielectric oxide and a dielectric nitride such as a stack of, in any order, silicon oxide and silicon nitride or boron nitride. The insulator layer may have a thickness between about 10 nm and about 200 nm. The insulator layer may eliminate leakage current between adjacent elements in the substrate 101 and reduce parasitic capacitance associated with source/drains.

It should be noted that, the term "about" modifying the quantity of an ingredient, component, or reactant of the present disclosure employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

With reference to FIGS. 2 and 3, a series of deposition processes may be performed to deposit a pad oxide 103 and a pad nitride 105 on the substrate 101. A photolithography process may be performed to form a first mask layer 801 on the pad nitride 105 and to define the position of the isolation layer 107.

With reference to FIGS. 4 and 5, after the photolithography process, an etching process, such as an anisotropic dry etch process, may be performed to form a first trench 701 penetrating through the pad oxide 103, the pad nitride 105, and extending to the substrate 101. After the formation of the first trench 701, the first mask layer 801 may be removed.

With reference to FIGS. 6 and 7, an insulating material such as silicon oxide, silicon nitride, silicon oxynitride, or silicon nitride oxide may be deposited into the first trench 701 and a planarization process, such as chemical mechanical polishing, may be subsequently performed to remove excess filling material until a top surface of the substrate 101 is exposed so as to form the isolation layer 107.

With reference to FIGS. 6 and 7, the isolation layer 107 may define the plurality of active areas AA. In some embodiments, the plurality of active areas AA may extend along a direction slant with respect to the X axis and the Y axis in a top-view perspective.

It should be noted that each of the active areas AA may comprise a portion of the substrate 101 and the space above the portion of the substrate 101. Describing an element as being disposed on the active area AA means that the element is disposed on a top surface of the portion of the substrate 101. Describing an element as being disposed in the active area AA means that the element is disposed in the portion of the substrate 101; however, a top surface of the element may be even with the top surface of the portion of the substrate 101. Describing an element as being disposed above the active area AA means that the element is disposed above the top surface of the portion of the substrate 101.

It should be noted that, in the description of the present disclosure, a surface of an element (or a feature) located at the highest vertical level along the Z axis is referred to as a top surface of the element (or the feature). A surface of an element (or a feature) located at the lowest vertical level along the Z axis is referred to as a bottom surface of the element (or the feature).

It should be noted that, in the description of the present disclosure, silicon oxynitride refers to a substance which contains silicon, nitrogen, and oxygen and in which a proportion of oxygen is greater than that of nitrogen. Silicon nitride oxide refers to a substance which contains silicon, oxygen, and nitrogen and in which a proportion of nitrogen is greater than that of oxygen.

With reference to FIGS. 8 and 9, a plurality of word line trenches 703 may be formed in the substrate 101 to define the position of a plurality of word line structures 200 which will be illustrated later. The plurality of word line trenches 703 may be formed by a photolithography process and a following etch process. In some embodiments, the plurality of word line trenches 703 may have a line shape and extend along the direction X and traversing the plurality of active areas AA in a top-view perspective. For example, each active area AA may be intersected with two word line trenches 703. The plurality of word line trenches 703 may divide each of the plurality of active areas AA into a plurality of first regions R1 and a plurality of second regions R2. For one active area AA, one first region R1 may be formed between the two word line trenches 703 and two second regions R2 may be respectively and correspondingly formed between the isolation layer 107 and the two word line trenches 703.

With reference to FIG. 1 and FIGS. 10 to 22, at step S13, a plurality of word line structures 200 may be formed in the plurality of word line trenches 703.

Figure 10:
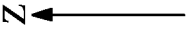

With reference to FIG. 10, a layer of first dielectric material 601 may be conformally formed on the pad nitride 105, on the isolation layer 107, and in the plurality of word line trenches 703. The layer of first dielectric material 601 may have a U-shaped cross-sectional profile in the plurality of word line trenches 703. In some embodiments, the layer of first dielectric material 601 may have a thickness in a range of about 1 nm to about 7 nm, including about 1 nm, about 2 nm, about 3 nm, about 4 nm, about 5 nm, about 6 nm, or about 7 nm.

In some embodiments, the layer of first dielectric material 601 may be formed by a thermal oxidation process. For example, the layer of first dielectric material 601 may be formed by oxidizing the surface of the plurality of word line trenches 703. In some embodiments, the layer of first dielectric material 601 may be formed by a deposition process such as a chemical vapor deposition or an atomic layer deposition. The first dielectric material 601 may include a high-k material, an oxide, a nitride, an oxynitride or combinations thereof. In some embodiments, after a liner polysilicon layer (not shown for clarity) is deposited, the layer of first dielectric material 601 may be formed by radical-oxidizing the liner polysilicon layer. In some embodiments, after a liner silicon nitride layer (not shown for clarity) is formed, the layer of first dielectric material 601 may be formed by radical-oxidizing the liner silicon nitride layer.

In some embodiments, the high-k material may include a hafnium-containing material. The hafnium-containing material may be, for example, hafnium oxide, hafnium silicon oxide, hafnium silicon oxynitride, or a combination thereof. In some embodiments, the high-k material may be, for example, lanthanum oxide, lanthanum aluminum oxide, zirconium oxide, zirconium silicon oxide, zirconium silicon oxynitride, aluminum oxide or a combination thereof.

Figure 11:
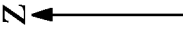

With reference to FIG. 11, a layer of first conductive material 611 may be formed on the layer of first dielectric material 601 and completely fill the plurality of word line trenches 703. In some embodiments, the first conductive material 611 may be a work function material such as, titanium, titanium nitride, silicon, silicon germanium, or a combination thereof. It should be noted that the term "work function" refers to the bulk chemical potential of a material (e.g., metal) relative to the vacuum level.

For example, in the present embodiment, the first conductive material 611 is titanium nitride and may be formed by chemical vapor deposition. In some embodiments, the formation of the layer of first conductive material 611 may include a source gas introducing step, a first purging step, a reactant flowing step, and a second purging step. The source gas introducing step, the first purging step, the reactant flowing step, and the second purging step may be referred to as one cycle. Multiple cycles may be performed to obtain the desired thickness of the layer of first conductive material 611.

Detailedly, the intermediate semiconductor device illustrated in FIG. 10 may be loaded in a reaction chamber. In the source gas introducing step, source gases containing a precursor and a reactant may be introduced to the reaction chamber containing the intermediate semiconductor device. The precursor and the reactant may diffuse across the boundary layer and reach the surface of the intermediate semiconductor device (i.e., the surfaces of the layer of first dielectric material 601). The precursor and the reactant may adsorb on and subsequently migrate on the surface aforementioned. The adsorbed precursor and the adsorbed reactant may react on the surface aforementioned and form solid byproducts. The solid byproducts may form nuclei on the surface aforementioned. The nuclei may grow into islands and the islands may merge into a continuous thin film on the surface aforementioned. In the first purging step, a purge gas such as argon may be injected into the reaction chamber to purge out the gaseous byproducts, unreacted precursor, and unreacted reactant.

In the reactant flowing step, the reactant may be solely introduced to the reaction chamber to turn the continuous thin film into the layer of first conductive material 611. In the second purging step, a purge gas such as argon may be injected into the reaction chamber to purge out the gaseous byproducts and unreacted reactant.

In some embodiments, the formation of the layer of first conductive material 611 using chemical vapor deposition may be performed with the assistance of plasma. The source of the plasma may be, for example, argon, hydrogen, or a combination thereof.

For example, the precursor may be titanium tetrachloride. The reactant may be ammonia. Titanium tetrachloride and ammonia may react on the surface and form a titanium nitride film including high chloride contamination due to incomplete reaction between titanium tetrachloride and ammonia. The ammonia in the reactant flowing step may reduce the chloride content of the titanium nitride film. After the ammonia treatment, the titanium nitride film may be referred to as the layer of first conductive material 611.

Alternatively, in some other embodiments, the layer of first conductive material 611 may be formed by atomic layer deposition such as photo-assisted atomic layer deposition or liquid injection atomic layer deposition. In some embodiments, the formation of the layer of first conductive material 611 may include a first precursor introducing step, a first purging step, a second precursor introducing step, and a second purging step. The first precursor introducing step, the first purging step, the second precursor introducing step, and the second purging step may be referred to as one cycle. Multiple cycles may be performed to obtain the desired thickness of the layer of first conductive material 611.

Detailedly, the intermediate semiconductor device illustrated in FIG. 10 may be loaded in the reaction chamber. In the first precursor introducing step, a first precursor may be introduced to the reaction chamber. The first precursor may diffuse across the boundary layer and reach the surface of the intermediate semiconductor device (i.e., the surface of the layer of first dielectric material 601). The first precursor may adsorb on the surface aforementioned to form a monolayer at a single atomic layer level. In the first purging step, a purge gas such as argon may be injected into the reaction chamber to purge out unreacted first precursor.

In the second precursor introducing step, a second precursor may be introduced to the reaction chamber. The second precursor may react with the monolayer and turn the monolayer into the layer of first conductive material 611. In the second purging step, a purge gas such as argon may be injected into the reaction chamber to purge out unreacted second precursor and gaseous byproduct. Compared to the chemical vapor deposition, a particle generation caused by a gas phase reaction may be suppressed because the first precursor and the second are separately introduced.

For example, the first precursor may be titanium tetrachloride. The second precursor may be ammonia. Adsorbed titanium tetrachloride may form a titanium nitride monolayer. The ammonia in the second precursor introducing step may react with the titanium nitride monolayer and turn the titanium nitride monolayer into the layer of first conductive material 611.

In some embodiments, the formation of the layer of first conductive material 611 using atomic layer deposition may be performed with the assistance of plasma. The source of the plasma may be, for example, argon, hydrogen, oxygen, or a combination thereof. In some embodiments, the oxygen source may be, for example, water, oxygen gas, or ozone. In some embodiments, co-reactants may be introduced to the reaction chamber. The co-reactants may be selected from the group consisting of hydrogen, hydrogen plasma, oxygen, air, water, ammonia, hydrazines, alkylhydrazines, boranes, silanes, ozone and a combination thereof.

Figure 12:
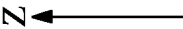

In some embodiments, the formation of the layer of first conductive material 611 may be performed using the following process conditions. The substrate temperature may be between about 160° C. and about 300° C. The evaporator temperature may be about 175° C. The pressure of the reaction chamber may be about 5 mbar. The solvent for the first precursor and the second precursor may be toluene. With reference to FIG. 12, a first etching back process may be performed to remove portions of the first conductive material 611. In some embodiments, the etch rate ratio of the first conductive material 611 to the first dielectric material 601 may be between about 100:1 and about 1.05:1, between about 15:1 and about 5:1, or between about 10:1 and about 5:1 during the first etching back process. After the first etching back process, the remaining first dielectric material 601 in the plurality of word line trenches 703 may be referred to as a plurality of bottom conductive layers 221.

Figure 13:
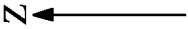

With reference to FIG. 13, a layer of first liner material 621 may be conformally formed on the layer of first dielectric material 601 and on the plurality of bottom conductive layers 221. In some embodiments, the first liner material 621 may be a material having etching selectivity to the first dielectric material 601. In some embodiments, the first dielectric material 601 may be a material having etching selectivity to the pad nitride 105. In some embodiments, the first liner material 621 may be, for example, a material including sp$^2$ hybridized carbon atoms. In some embodiments, the first liner material 621 may be, for example, a material including carbons having hexagonal crystal structures. In some embodiments, the first liner material 621 may be, for example, graphene, graphite, or the like.

In some embodiments, the layer of first liner material 621 may be formed on a catalyst substrate and then transferred onto the intermediate semiconductor device illustrated in FIG. 12. The catalyst substrate may include nickel, copper, cobalt, platinum, silver, ruthenium, iridium, palladium, alloy of iron and nickel, alloy of copper and nickel, alloy of nickel and molybdenum, alloy of gold and nickel, and alloy of cobalt and copper.

In some embodiments, the layer of first liner material 621 may be formed with the assistance of catalysts. The catalysts may be single crystalline metal or polycrystalline metal, binary alloy, or liquid metal. The single crystalline metal or polycrystalline metal may be, for example, nickel, copper, cobalt, platinum, silver, ruthenium, iridium, or palladium. The binary alloy may be, for example, alloy of iron and nickel, alloy of copper and nickel, alloy of nickel and molybdenum, alloy of gold and nickel, and alloy of cobalt and copper. The liquid metal may be, for example, liquid gallium, liquid indium, or liquid copper.

In some embodiments, a catalytic conductive layer (not shown for clarity) may be conformally formed on the layer of first dielectric material 601 and on the plurality of bottom conductive layers 221. The layer of first liner material 621 may be formed on the catalytic conductive layer. The catalytic conductive layer may include nickel, copper, cobalt, platinum, silver, ruthenium, iridium, palladium, alloy of iron and nickel, alloy of copper and nickel, alloy of nickel and molybdenum, alloy of gold and nickel, and alloy of cobalt and copper.

Figure 14:
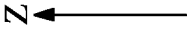

With reference to FIG. 14, a layer of second conductive material 613 may be formed on the layer of first liner material 621 and completely fill the plurality of word line trenches 703. In some embodiments, the second conductive material 613 may be, for example, tungsten, tungsten nitride, or a combination thereof. In some embodiments, the layer of second conductive material 613 may be formed by, for example, a pulse nucleation method, chemical vapor deposition, physical vapor deposition, or other applicable deposition processes. In some embodiments, a planarization process, such as chemical mechanical polishing, may be performed to remove excess material and provide a substantially flat surface for subsequent processing steps.

Figure 15:
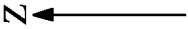

With reference to FIG. 15, a second etching back process may be performed to remove portions of the second conductive material 613. In some embodiments, the etch rate ratio of the second conductive material 613 to the first liner material 621 may be between about 100:1 and about 1.05:1, between about 15:1 and about 2:1, or between about 10:1 and about 2:1 during the second etching back process. After the second etching back process, the remaining second conductive material 613 in the plurality of word line trenches 703 may be referred to as a plurality of middle conductive layers 223.

Figure 16:
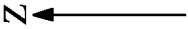

With reference to FIG. 16, a layer of second liner material 623 may be conformally formed on the layer of first liner material 621 and on the plurality of middle conductive layers 223. In some embodiments, the second liner material 623 may be a material having etching selectivity to the first dielectric material 601. In some embodiments, the second liner material 623 may be the same material as the first liner material 621. In some embodiments, the second liner material 623 may be a material having etching selectivity to the pad nitride 105. In some embodiments, the second liner material 623 may be, for example, a material including sp$^2$ hybridized carbon atoms. In some embodiments, the second liner material 623 may be, for example, a material including carbons having hexagonal crystal structures. In some embodiments, the second liner material 623 may be, for example, graphene, graphite, or the like.

In some embodiments, the layer of second liner material 623 may be formed on a catalyst substrate and then transferred onto the intermediate semiconductor device illustrated in FIG. 15. The catalyst substrate may include nickel, copper, cobalt, platinum, silver, ruthenium, iridium, palladium, alloy of iron and nickel, alloy of copper and nickel, alloy of nickel and molybdenum, alloy of gold and nickel, and alloy of cobalt and copper.

In some embodiments, the layer of second liner material 623 may be formed with the assistance of catalysts. The catalysts may be single crystalline metal or polycrystalline metal, binary alloy, or liquid metal. The single crystalline metal or polycrystalline metal may be, for example, nickel, copper, cobalt, platinum, silver, ruthenium, iridium, or palladium. The binary alloy may be, for example, alloy of iron and nickel, alloy of copper and nickel, alloy of nickel and molybdenum, alloy of gold and nickel, and alloy of cobalt and copper. The liquid metal may be, for example, liquid gallium, liquid indium, or liquid copper.

In some embodiments, a catalytic conductive layer (not shown for clarity) may be conformally formed on the layer of first liner material 621 and on the plurality of middle conductive layers 223. The layer of second liner material 623 may be formed on the catalytic conductive layer. The catalytic conductive layer may include nickel, copper, cobalt, platinum, silver, ruthenium, iridium, palladium, alloy of iron and nickel, alloy of copper and nickel, alloy of nickel and molybdenum, alloy of gold and nickel, and alloy of cobalt and copper.

Figure 17:
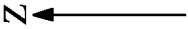

With reference to FIG. 17, a layer of third conductive material 615 may be formed on the layer of second liner material 623 and to completely fill the plurality of word line trenches 703. A planarization process, such as chemical mechanical polishing, may be performed to remove excess material and provide a substantially flat surface for subsequent processing steps. In some embodiments, the third conductive material 615 may be, for example, molybdenum or other applicable conductive materials.

In some embodiments, the third conductive material 615 may be formed by a chemical vapor deposition process. For example, the intermediate semiconductor device illustrated in FIG. 16 may be exposed to a molybdenum precursor and a reactant. In some embodiments, the reactant may flow continuously and the molybdenum precursor flow to the chamber may be turned on and off.

In some embodiments, the molybdenum precursor may include a molybdenum halide. In some embodiments, the molybdenum halide may include molybdenum fluoride, molybdenum chloride, or combinations thereof. In some embodiments, the molybdenum precursor may be flowed over the intermediate semiconductor device illustrated in FIG. 16 using a carrier gas. In some embodiments, the carrier gas may be flowed through an ampoule including the molybdenum precursor. In some embodiments, the carrier gas may be an inert gas. In some embodiments, the inert gas may include one or more of $N_2$, Ar, and He.

In some embodiments, the flow rate of the molybdenum precursor may be in a range of from 100 slm to 1000 slm, from 100 slm to 700 slm, from 100 slm to 400 slm, from 400 slm to 1000 slm, from 400 slm to 700 slm or from 700 slm to 1000 slm. In some embodiments, the duration of the molybdenum precursor may be in a range of from 0.3 seconds to 5 seconds, from 0.3 seconds to 3 seconds, from 0.3 seconds to 1 seconds, from 1 seconds to 5 seconds, from 1 seconds to 3 seconds or from 3 seconds to 5 seconds.

In some embodiments, the intermediate semiconductor device illustrated in FIG. 16 may be exposed to a continuous flow or a plurality of pulses of the molybdenum precursor. In some embodiments, the plurality of pulses of the molybdenum precursor may have a wait time in a range of from 0.3 seconds to 30 seconds, from 0.3 seconds to 10 seconds, from 0.3 seconds to 5 seconds, from 0.3 seconds to 1 seconds, from 0.5 seconds to 5 seconds, from 1 seconds to 30 seconds, from 1 seconds to 10 seconds, from 1 seconds to 5 seconds, from 5 seconds to 30 seconds, from 5 seconds to 10 seconds or from 10 seconds to 30 seconds.

In some embodiments, each of the plurality of pulses of the molybdenum precursor may be applied for a time duration in a range of from 0.3 seconds to 5 seconds, from 0.3 seconds to 3 seconds, from 0.3 seconds to 1 seconds, from 1 seconds to 5 seconds, from 1 seconds to 3 seconds or from 3 seconds to 5 seconds. In some embodiments, at least one of the plurality of pulses of the molybdenum precursor may be applied for a time duration in a range of from 0.3 seconds to 5 seconds, from 0.3 seconds to 3 seconds, from 0.3 seconds to 1 seconds, from 1 seconds to 5 seconds, from 1 seconds to 3 seconds or from 3 seconds to 5 seconds.

In some embodiments, the reactant may include an oxidizing agent, a reducing agent, or a combination thereof. In some embodiments, the reactant may include hydrogen, ammonia, silane, polysilane, or a combination thereof. In some embodiments, silane may be selected from one or more of disilane, trisilane, tetrasilane, higher order silanes, and substituted silane. In some embodiments, the first reactant may be flowed over the intermediate semiconductor device illustrated in FIG. 16 using a carrier gas. In some embodiments, the carrier gas may be an inert gas. In some embodiments, the inert gas may include one or more of $N_2$, Ar, and He.

In some embodiments, the flow rate of the reactant may be in a range of from 0.5 slm to 15 slm, from 0.5 slm to 10 slm, from 0.5 slm to 5 slm, from 5 slm to 15 slm, from 5 slm to 10 slm or from 10 slm to 15 slm. In some embodiments, the duration of the reactant may be in a range of from 0.5 seconds to 10 seconds, from 0.5 seconds to 5 seconds, from 0.5 seconds to 1 seconds, from 1 seconds to 10 seconds, from 1 seconds to 5 seconds or from 5 seconds to 10 seconds.

In some embodiments, the intermediate semiconductor device illustrated in FIG. 16 may be exposed to a continuous flow or a plurality of pulses of the reactant. In some embodiments, the plurality of pulses of the reactant may have a wait time in a range of from 0.3 seconds to 30 seconds, from 0.3 seconds to 10 seconds, from 0.3 seconds to 5 seconds, from 0.3 seconds to 1 seconds, from 0.5 seconds to 5 seconds, from 1 seconds to 30 seconds, from 1 seconds to 10 seconds, from 1 seconds to 5 seconds, from 5 seconds to 30 seconds, from 5 seconds to 10 seconds or from 10 seconds to 30 seconds.

In some embodiments, each of the plurality of pulses of the reactant may be applied for a time duration in a range of from 0.5 seconds to 10 seconds, from 0.5 seconds to 5 seconds, from 0.5 seconds to 1 seconds, from 1 seconds to 10 seconds, from 1 seconds to 5 seconds or from 5 seconds to 10 seconds. In some embodiments, at least one of the plurality of pulses of the reactant may be applied for a time duration in a range of from 0.5 seconds to 10 seconds, from 0.5 seconds to 5 seconds, from 0.5 seconds to 1 seconds, from 1 seconds to 10 seconds, from 1 seconds to 5 seconds or from 5 seconds to 10 seconds.

In some embodiments, the layer of third conductive material 615 may be formed at a pressure in a range of from 2 Torr to 60 Torr, from 2 Torr to 40 Torr, from 2 Torr to 20 Torr, from 20 Torr to 60 Torr, from 20 Torr to 40 Torr or from 40 Torr to 60 Torr. In some embodiments, the layer of third conductive material 615 may be formed at a temperature in a range of from 350° C. to 550° C., from 350° C. to 500° C., from 350° C. to 450° C., from 350° C. to 400° C., from 400° C. to 550° C., from 400° C. to 500° C., from 400° C. to 450° C., from 450° C. to 550° C., from 450° C. to 500° C. or from 500° C. to 550° C.

In some embodiments, an optional annealing process may be performed after the formation of the layer of third conductive material 615. In some embodiments, the annealing process may be performed at a temperature greater that the temperature of forming the layer of third conductive material 615. In some embodiments, the annealing process may be performed at temperatures in the range of from 100° C. to 550° C., from 100° C. to 450° C., from 100° C. to 350° C., from 100° C. to 250° C., from 200° C. to 550° C., from 200° C. to 450° C., from 200° C. to 350° C., from 300° C. to 550° C., from 300° C. to 450° C. or from 400° C. to 550° C.

In some embodiments, the environment of the annealing process may include one or more of an inert gas (e.g., molecular nitrogen, argon) or a reducing gas (e.g., molecular hydrogen or ammonia).

In some embodiments, the duration of the annealing process may be in the range of from 1 hour to 24 hour, from 1 hour to 20 hour, from 1 hour to 15 hour, from 1 hour to 10 hour, from 1 hour to 5 hour, from 5 hour to 24 hour, from 5 hour to 20 hour, from 5 hour to 15 hour, from 5 hour to 10 hour, from 10 hour to 24 hour, from 10 hour to 20 hour, from 10 hour to 15 hour, from 15 hour to 24 hour, from 15 hour to 20 hour or from 20 hour to 24 hour. The annealing process may increase the density, decrease the resistivity, and/or increase the purity of the layer of third conductive material 615.

Figure 18:
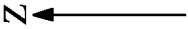

With reference to FIG. 18, a third etching back process may be performed to remove portions of the third conductive material 615. In some embodiments, the etch rate ratio of the third conductive material 615 to the second liner material 623 may be between about 100:1 and about 1.05:1, between about 15:1 and about 2:1, or between about 10:1 and about 2:1 during the third etching back process.

After the third etching back process, the remaining second liner material 623 in the plurality of word line trenches 703 may be referred to as a plurality of top conductive layers 225.

Figure 19:
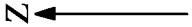

With reference to FIG. 19, a removal process may be performed to remove portions of the second liner material 623, the first liner material 621, and the first dielectric material 601. In some embodiments, the removal process may be a multi-stage etching process. For example, the removal process may be a two-stage anisotropic dry etching process. The etching chemistry may be different for each stage to provide different etching selectivity.

In some embodiments, the etch rate ratio of the second liner material 623 (and the first liner material 621) to the first dielectric material 601 may be between about 100:1 and about 1.05:1, between about 15:1 and about 2:1, or between about 10:1 and about 2:1 during the first stage of the removal process. In some embodiments, the etch rate ratio of the second liner material 623 (and the first liner material 621) to the plurality of top conductive layers 225 may be between about 100:1 and about 1.05:1, between about 15:1 and about 2:1, or between about 10:1 and about 2:1 during the first stage of the removal process.

In some embodiments, the etch rate ratio of the first dielectric material 601 to the pad nitride 105 may be between about 100:1 and about 1.05:1, between about 15:1 and about 2:1, or between about 10:1 and about 2:1 during the second stage of the removal process. In some embodiments, the etch rate ratio of the first dielectric material 601 to the plurality of top conductive layers 225 may be between about 100:1 and about 1.05:1, between about 15:1 and about 2:1, or between about 10:1 and about 2:1 during the second stage of the removal process.

With reference to FIG. 19, after the removal process, the remaining second liner material 623 in the plurality of word line trenches 703 may be referred to as a plurality of top liner layers 233. The plurality of top liner layers 233 may have a U-shaped cross-sectional profile. The remaining first liner material 621 in the plurality of word line trenches 703 may be referred to as a plurality of bottom liner layers 231. The plurality of bottom liner layers 231 may have a U-shaped cross-sectional profile. The remaining first dielectric material 601 in the plurality of word line trenches 703 may be referred to as a plurality of word line dielectric layers 211. The plurality of word line dielectric layers 211 may have a U-shaped cross-sectional profile. In some embodiments, the top surfaces 211TS of the plurality of word line dielectric layers 211, the top surfaces 231TS of the plurality of bottom liner layers 231, the top surfaces 233TS of the plurality of top liner layers 233, and the top surfaces 225TS of the plurality of top conductive layers 225 may be substantially coplanar.

Figure 20:
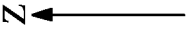
Figure 21:
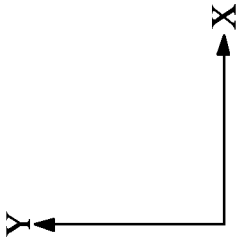
FIG. 21 illustrates, in a schematic top-view diagram, an intermediate semiconductor device in accordance with one embodiment of the present disclosure.

With reference to FIG. 20, a layer of capping material 603 may be formed to completely fill the plurality of word line trenches 703. In some embodiments, the capping material 603 may be, for example, silicon oxide, silicon nitride, silicon oxynitride, silicon nitride oxide, or other applicable insulating materials. In some embodiments, the capping material 603 may be, for example, germanium oxide. In some embodiments, the layer of capping material 603 may be formed by, for example, chemical vapor deposition, atomic layer deposition, or other applicable deposition processes.

For example, when the layer of capping material 603 is formed by atomic layer deposition, the atomic layer deposition process may include alternately and sequentially contacting the intermediate semiconductor device illustrated in FIG. 19 with a vapor phase germanium precursor and an oxygen-containing reactant (also referred to as the oxygen source), such that a layer of the germanium precursor is formed on the surface of the intermediate semiconductor device, and the oxygen-containing reactant subsequently reacts with the germanium precursor to form the layer of capping material 603.

Detailedly, the germanium precursor may be conducted into the process chamber containing the intermediate semiconductor device illustrated in FIG. 19 in the form of vapor phase pulse and contacted with the surface of the intermediate semiconductor device. The excess germanium precursor and reaction byproducts, if any, may be removed from the intermediate semiconductor device and the surface of the intermediate semiconductor device and from proximity to the intermediate semiconductor device and the surface of the intermediate semiconductor device.

In some embodiments, the excess germanium precursor and reaction byproducts, if any, may be removed by purging. Purging may be accomplished for example, with a pulse of inert gas such as nitrogen or argon. Purging the process chamber means that vapor phase precursors and/or vapor phase byproducts are removed from the process chamber such as by evacuating the process chamber with a vacuum pump and/or by replacing the gas inside the process chamber with an inert gas such as argon or nitrogen. In some embodiments, the purging times may be between about 0.05 seconds and about 20 seconds, between about 1 second and about 10 seconds, or between about 1 second and about 20 seconds.

The gaseous oxygen source may be pulsed into the process chamber where it reacts with the germanium precursor on the surface of the intermediate semiconductor device to form the layer of capping material 603 formed of germanium oxide. Excess oxygen source and gaseous byproducts of the surface reaction may be removed from the intermediate semiconductor device, for example by purging them out of the process chamber with the aid of an inert gas.

The steps of pulsing and removing may be repeated until the desired thickness has been formed on the intermediate semiconductor device.

In some embodiments, the germanium precursor is not a halide. In some embodiments, the germanium precursor may include a halogen in at least one ligand, but not in all ligands. In some embodiments, the germanium precursor may include germanium ethoxide or tetrakis(dimethylamino) germanium.

In some embodiments, the oxygen source may be water, ozone, oxygen plasma, oxygen radicals, or oxygen atoms. In some embodiments, the oxygen source is not water. In some embodiments, the germanium precursor employed in the processes may be solid, liquid, or gaseous material under standard conditions (room temperature and atmospheric pressure), provided that the germanium precursor is in vapor phase before it is conducted into the process chamber and contacted with the intermediate semiconductor device.

It should be noted that, in the present disclosure, "pulsing" a vaporized precursor onto a feature means that the precursor vapor is conducted into the process chamber for a limited period of time. In some embodiments, the germanium precursor may be pulsed between about 0.05 seconds and about 10 seconds, between about 0.1 seconds and about 5 seconds, or between about 0.3 seconds and about 3.0 seconds. In some embodiments, the oxygen source may be pulsed between about 0.05 seconds and about 10 seconds, between about 0.1 seconds and about 5 seconds, or between about 0.2 seconds to about 3.0 seconds.

In some embodiments, the oxygen source may be an oxygen-containing gas pulse and can be a mixture of oxygen and inactive gas, such as nitrogen or argon. In some embodiments the oxygen source may be a molecular oxygen-containing gas pulse. The oxygen content of the oxygen-source gas may be between about 10% and about 25%. Thus, one source of oxygen may be air.

In some embodiments, the oxygen source may be molecular oxygen. In some embodiments, the oxygen source may include an activated or excited oxygen species. In some embodiments, the oxygen source may include ozone. In some embodiments, the oxygen source may be pure ozone or a mixture of ozone, molecular oxygen, and another gas, for example an inactive gas such as nitrogen or argon.

Ozone can be produced by an ozone generator, and it may be introduced into the process chamber with the aid of an inert gas, such as nitrogen, or with the aid of oxygen. In some embodiments, ozone may be provided at a concentration between about 5 vol-% and about 40 vol-%, or between about 15 vol-% and about 25 vol-%. In some embodiments, the oxygen source may be oxygen plasma. In some embodiments, ozone or a mixture of ozone and another gas may be pulsed into the process chamber. In some embodiments, ozone may be formed inside the process chamber, for example by conducting oxygen containing gas through an arc. In some embodiments, an oxygen-containing plasma may be formed in the process chamber. In some embodiments, the plasma may be formed upstream of the process chamber in a remote plasma generator and plasma products may be directed to the process chamber to contact the intermediate semiconductor device.

In some embodiments, the oxygen source may be an oxygen source other than water. Thus, water is not provided in those embodiments.

In some embodiments, the temperature of forming the layer of capping material 603 may be between about 20° C. and about 600° C., between about 100° C. and about 400° C., or between about 150° C. and about 300° C.

In some embodiments, the layer of capping material 603 is a pure germanium oxide layer. That is, aside from minor impurities no other metal or semi-metal elements are present in the layer of capping material 603. In some embodiments, the layer of capping material 603 may include less than 1-at % of metal or semi-metal other than germanium. In some embodiments, the layer of capping material 603 may include less than about 5-at % of any impurity other than hydrogen, less than about 3-at % of any impurity other than hydrogen, or less than about 1-at % of any impurity other than hydrogen.

With reference to FIGS. 21 and 22, a planarization process may be performed until the top surface of the pad nitride 105 is exposed. After the planarization process, the remaining capping material 603 may be referred to as the plurality of word line capping layers 213. In some embodiments, the planarization process may be an etching process, a chemical mechanical polishing process, or a combination thereof. In the current stage, the top surface of the pad nitride 105 and the top surfaces of the plurality of word line capping layers 213 may be substantially coplanar.

With reference to FIGS. 21 and 22, the plurality of word line dielectric layers 211, the plurality of word line capping layers 213, the plurality of bottom conductive layers 221, the plurality of middle conductive layers 223, the plurality of top conductive layers 225, the plurality of bottom liner layers 231, and the plurality of top liner layers 233 together configure the plurality of word line structures 200.

In some embodiments, the bottom liner layer 231 and the middle conductive layer 223 may be configured to tune the work function cooperating with the bottom conductive layer 221 so as to obtain the word line structure 200 has a low resistance. As a result, the performance of the word line structure 200 may be improved.

By employing the word line capping layer 213 formed of germanium oxide, the leakage of the word line structure 200 may be prevented and the trap density may be decreased. As a result, the performance of the semiconductor device 1A may be improved.

In some embodiments, the plurality of word line structures 200 may have a work function greater than or equal to 4.3 eV. In some embodiments, the plurality of word line structures 200 may have a work function greater than or equal to 4.5 eV. In some embodiments, the plurality of word line structures 200 may have a work function greater than or equal to 4.3 eV, including greater than or equal to 4.4 eV, greater than or equal to 4.5 eV, greater than or equal to 4.6 eV, greater than or equal to 4.7 eV, greater than or equal to 4.8 eV, greater than or equal to 4.9 eV, greater than or equal to 5.0 eV, greater than or equal to 5.1 eV, or greater than or equal to 5.2 eV.

In some embodiments, the plurality of word line structures 200 may have a resistance less than or equal to 40 $\mu\Omega$-cm, less than or equal to 30 $\mu\Omega$-cm, less than or equal to 25 $\mu\Omega$-cm, or less than or equal to 20 $\mu\Omega$-cm, or less than or equal to 15 $\mu\Omega$-cm at a total thickness of 100 Å. In some embodiments, the plurality of word line structures 200 may have a resistance less than or equal to 20 $\mu\Omega$-cm at a total thickness of 100 Å. In some embodiments, the plurality of word line structures 200 may have a resistance in a range of from 50 $\mu\Omega$-cm to 5$\mu\Omega$-cm, from 40$\mu\Omega$-cm to 10$\mu\Omega$-cm, from 30$\mu\Omega$-cm to 10 $\mu\Omega$-cm, from 25 $\mu\Omega$-cm to 10 $\mu\Omega$-cm, from 20 $\mu\Omega$-cm to 10 $\mu\Omega$-cm at a total thickness of 100 Å.

Figure 23:
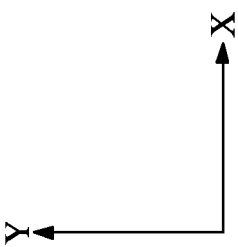
FIG. 23 illustrates, in a schematic top-view diagram, an intermediate semiconductor device in accordance with one embodiment of the present disclosure.
Figure 25:
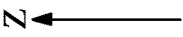
Figure 26:
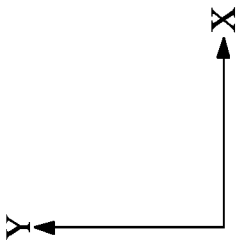
FIG. 26 illustrates, in a schematic top-view diagram, an intermediate semiconductor device in accordance with one embodiment of the present disclosure.
Figure 28:
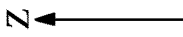
Figure 29:
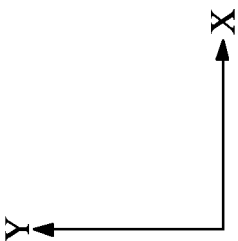
FIG. 29 illustrates, in a schematic top-view diagram, an intermediate semiconductor device in accordance with one embodiment of the present disclosure.
Figure 30:

FIG. 23 illustrates, in a schematic top-view diagram, an intermediate semiconductor device in accordance with one embodiment of the present disclosure. FIGS. 24 and 25 are schematic cross-sectional view diagrams taken along lines A-A' and B-B' in FIG. 23 illustrating part of the flow for fabricating the semiconductor device 1A in accordance with one embodiment of the present disclosure. FIG. 26 illustrates, in a schematic top-view diagram, an intermediate semiconductor device in accordance with one embodiment of the present disclosure. FIGS. 27 and 28 are schematic cross-sectional view diagrams taken along lines A-A' and B-B' in FIG. 26 illustrating part of the flow for fabricating the semiconductor device 1A in accordance with one embodiment of the present disclosure. FIG. 29 illustrates, in a schematic top-view diagram, an intermediate semiconductor device in accordance with one embodiment of the present disclosure. FIGS. 30 and 31 are schematic cross-sectional view diagrams taken along lines A-A' and B-B' in FIG. 29 illustrating part of the flow for fabricating the semiconductor device 1A in accordance with one embodiment of the present disclosure.

With reference to FIG. 1 and FIGS. 23 to 27, at step S15, a plurality of openings 705 may be formed in the plurality of first regions R1 and a plurality of in-recess spacers 301 may be formed in the plurality of openings 705.

With reference to FIGS. 23 and 24, the plurality of openings 705 may be formed by a photolithography process and a subsequent etching process. The bottom surface 705BS of the opening 705 may be at a vertical level VL1 between the bottom surface 213BS of the word line capping layer 213 and the top surface 101TS of the substrate 101. In some embodiments, the opening 705 may have a square-shaped cross-sectional profile in a top-view perspective but is not limited to that shape. In some embodiments, the opening 705 may have a rectangle-shaped, a circle-shaped, or other applicable shaped cross-sectional profile in a top-view perspective.

With reference to FIG. 25, a layer of spacer material 605 may be conformally formed on the pad nitride 105, on the isolation layer 107, and on the plurality of openings 705. In some embodiments, the layer of spacer material 605 may be formed by, for example, atomic layer deposition, chemical vapor deposition, or other applicable deposition process. In some embodiments, the spacer material 605 may be a material having etching selectivity to the word line capping layer 213. In some embodiments, the spacer material 605 may be, for example, silicon oxide, silicon nitride, silicon oxynitride, silicon nitride oxide, boron nitride, silicon boron nitride, phosphorus boron nitride, boron carbon silicon nitride, or other applicable insulating material.

With reference to FIGS. 26 and 27, a spacer etching process may be performed to remove portions of the spacer material 605. The remaining spacer material 605 may be referred to as the plurality of in-recess spacers 301. In some embodiments, the spacer etching process may be, for example, an anisotropic etching process such as reactive ion etching.

In some embodiments, the in-recess spacer 301 may have a square ring-shaped cross-sectional profile in a top-view perspective but is not limited to that shape. In some embodiments, the in-recess spacer 301 may have a rectangular ring-shaped, a ring-shaped, or other applicable shaped cross-sectional profile in a top-view perspective.

In some embodiments, the bottom surface 301BS of the in-recess spacer 301 may be at the vertical level VL1 between the bottom surface 213BS of the word line capping layer 213 and the top surface 101TS of the substrate 101. In some embodiments, the top portion of the in-recess spacer 301 may be lower than the top surface 101TS of the substrate 101. In some embodiments, the portion of in-recess spacer 301 extending along the direction X (in a top-view perspective) may be disposed against on the word line capping layer 213 (in a cross-sectional perspective). The portion of the in-recess spacer 301 extending along the direction Y (in a top-view perspective) may be disposed against on the substrate 101 (in a cross-sectional perspective).

With reference to FIG. 1 and FIGS. 28 to 31, at step S17, a plurality of buried conductive layers 401 may be formed in the plurality of openings 705.

With reference to FIG. 28, a layer of fourth conductive material 617 may be formed to cover the plurality of in-recess spacers 301 and completely fill the plurality of openings 705. In some embodiments, the layer of fourth conductive material 617 may be formed by, for example, chemical vapor deposition, plasma-enhanced chemical vapor deposition, physical vapor deposition, sputtering, electroplating, electroless plating, or other applicable deposition processes. In some embodiments, the fourth conductive material 617 may be, for example, tungsten, cobalt, zirconium, tantalum, titanium, aluminum, ruthenium, copper, metal carbides (e.g., tantalum carbide, titanium carbide, tantalum magnesium carbide), metal nitrides (e.g., titanium nitride), transition metal aluminides, or a combination thereof.

With reference to FIGS. 29 and 30, a planarization process may be performed until the plurality of word line capping layers 213 are exposed to remove excess material and provide a substantially flat surface for subsequent processing steps. The remaining fourth conductive material 617 may be referred to as the plurality of buried conductive layers 401. In the current stage, the top surface 213TS of the word line capping layer 213 and the top surface of the buried conductive layer 401, and the top surface of the pad nitride 105 may be substantially coplanar. In some embodiments, the planarization process may be an etching process, a chemical mechanical polishing process, or a combination thereof.

With reference to FIG. 31, a planarization process, such as chemical mechanical polishing, may be performed until the top surface 101TS of the substrate 101 is exposed to remove the pad oxide 103 and the pad nitride 105. In the current stage, the top surface of the buried conductive layer 401, the top surface 213TS of the word line capping layer 213, and the top surface 101TS of the substrate 101 may be substantially coplanar.

The buried conductive layer 401 may include a bottom portion 411 and a top portion 413. The bottom portion 411 may be disposed in the opening 705. The bottom surface 411BS of the bottom portion 411 may contact the substrate 101. The bottom surface 411BS of the bottom portion 411 (i.e., the bottom surface of the buried conductive layer 401) and the bottom surface 301BS of the in-recess spacer 301 may be substantially coplanar. The sidewalls 411SW of the bottom portion 411 may be surrounded by the in-recess spacer 301. The bottom surface 411BS of the bottom portion 411 may be at the vertical level VL1 higher than the bottom surface 213BS of the word line capping layer 213. Alternatively, in some embodiments, the bottom surface 411BS of the bottom portion 411 and the bottom surface 301BS of the in-recess spacer 301 may be at a vertical level (not shown) lower than the bottom surface 213BS of the word line capping layer 213.

The top portion 413 may be disposed on the bottom portion 411 and cover the top portion of the in-recess spacer 301. The top surface 413TS of the top portion 413 (i.e., the top surface of the buried conductive layer 401), the top surface 213TS of the word line capping layer 213, and the top surface 101TS of the substrate 101 may be substantially coplanar. The sidewall 413SW of the top portion 413 and the sidewall 301SW of the in-recess spacer 301 may be substantially coplanar.

In some embodiments, the width ratio of the width W1 of the bottom surface 411BS of the bottom portion 411 to the width W2 of the top surface 413TS of the top portion 413 may be between about 0.5 and about 0.95. In some embodiments, the ratio of the thickness T1 of the in-recess spacer 301 to the width W2 of the top surface 413TS of the top portion 413 may be between about 0.025 and about 0.25. In some embodiments, the height ratio of the height H1 of the in-recess spacer 301 to the height H2 of the buried conductive layer 401 may be between about 0.5 and about 0.85.

The electrical field near the buried conductive layer 401 may be reduced by employing the in-recess spacer 301. Therefore, the Gate-Induced Drain Leakage (GIDL) may be reduced due to the electrical field reduction. As a result, the performance of the semiconductor device 1A may be improved.

Figure 32:
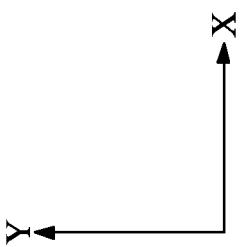
FIG. 32 illustrates, in a schematic top-view diagram, an intermediate semiconductor device in accordance with another embodiment of the present disclosure.
Figure 33:
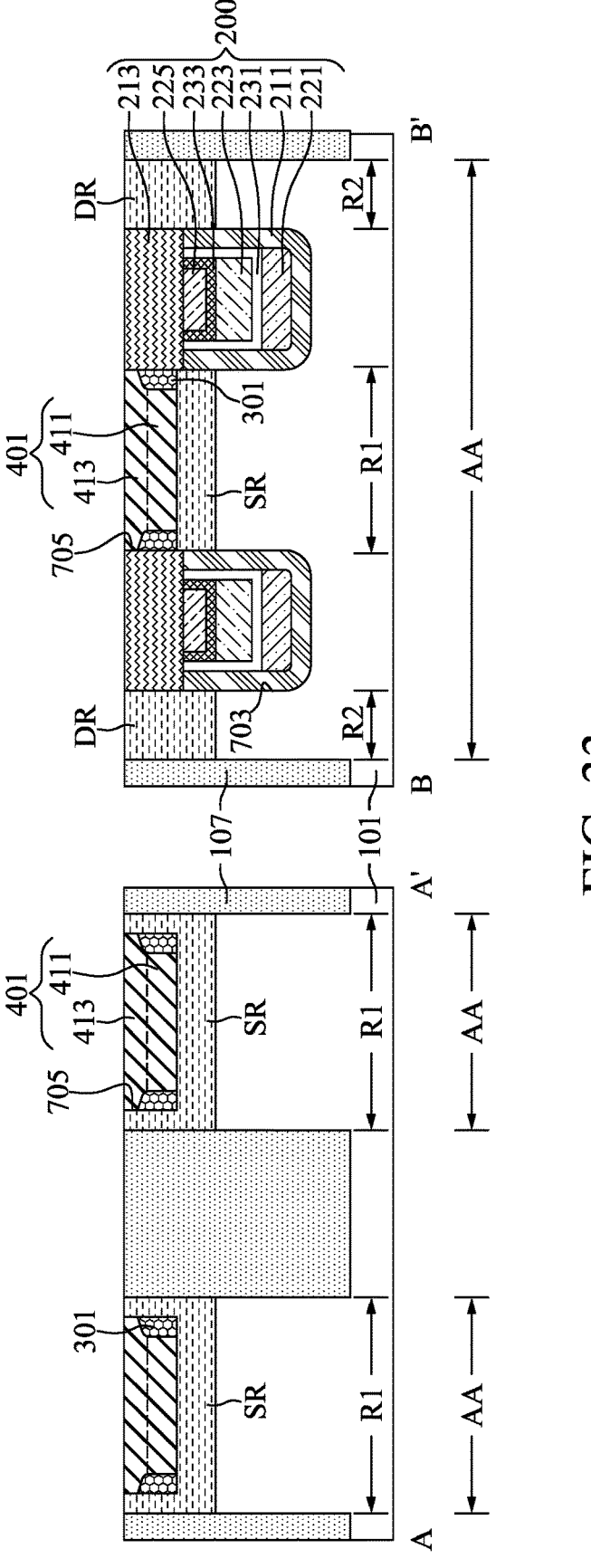
FIG. 33 is a schematic cross-sectional view diagram taken along lines A-A' and B-B' in FIG. 32.

FIG. 32 illustrates, in a schematic top-view diagram, an intermediate semiconductor device in accordance with another embodiment of the present disclosure. FIG. 33 is a schematic cross-sectional view diagram taken along lines A-A' and B-B' in FIG. 32.

With reference to FIGS. 32 and 33, the semiconductor device 1B may have a structure similar to that illustrated in FIG. 31. The same or similar elements in FIGS. 32 and 33 as in FIG. 31 have been marked with similar reference numbers and duplicative descriptions have been omitted.

With reference to FIGS. 32 and 33, the semiconductor device 1B may include a plurality of sources SR and a plurality of drains DR. The plurality of sources SR may be disposed in the plurality of first regions R1, respectively and correspondingly. The plurality of drains DR may be disposed in the plurality of second regions R2, respectively and correspondingly. The plurality of in-recess spacers 301 and the plurality of buried conductive layers 401 may be disposed in the plurality of sources SR, respectively and correspondingly.

The plurality of sources SR and the plurality of drains DR may be formed by an implantation process. The implantation process may employ, for example, n-type dopants. The n-type dopants may be added to an intrinsic semiconductor to contribute free electrons to the intrinsic semiconductor. In a silicon-containing substrate, examples of n-type dopants, i.e., impurities, include but are not limited to antimony, arsenic, and phosphorous. In some embodiments, the dopant concentration of the plurality of sources SR and the plurality of drains DR may be between about 1E19 atoms/cm^3 and about 1E21 atoms/cm^3; although other dopant concentrations that are lesser than, or greater than, the aforementioned range may also be employed in the present application.

In some embodiments, an annealing process may be performed to activate the plurality of sources SR and the plurality of drains DR. The annealing process may have a process temperature between about 800° C. and about 1250° C. The annealing process may have a process duration between about 1 millisecond and about 500 milliseconds. The annealing process may be, for example, a rapid thermal anneal, a laser spike anneal, or a flash lamp anneal.

One aspect of the present disclosure provides a semiconductor device including a substrate; a buried conductive layer including a bottom portion positioned in the substrate, and a top portion positioned in the substrate and positioned on the bottom portion; and an in-recess spacer positioned in the substrate, surrounding the bottom portion, and covered by the top portion. A top surface of the top portion and a top surface of the substrate are substantially coplanar. A bottom surface of the in-recess spacer and a bottom surface of the bottom portion are substantially coplanar. A sidewall of the in-recess spacer and a sidewall of the top portion are substantially coplanar.

Another aspect of the present disclosure provide a semiconductor device including a substrate; a plurality of word line structures positioned in the substrate; a buried conductive layer including a bottom portion positioned in the substrate and between the plurality of word line structures, and a top portion positioned in the substrate, on the bottom portion, and between the plurality of word line structures; and an in-recess spacer positioned in the substrate, between the plurality of word line structures, surrounding the bottom portion, and covered by the top portion. A top surface of the top portion, a top surface of the substrate, and top surfaces of the plurality of word line structures are substantially coplanar. A bottom surface of the in-recess spacer and a bottom surface of the bottom portion are substantially coplanar. A sidewall of the in-recess spacer and a sidewall of the top portion are substantially coplanar.

Another aspect of the present disclosure provides a method for fabricating a semiconductor device including providing a substrate; forming an opening in the substrate; conformally forming a layer of spacer material in the opening; performing a spacer etching process to remove a portion of the spacer material and form an in-recess spacer in the opening; and forming a buried conductive layer in the opening and covering the in-recess spacer.

Due to the design of the semiconductor device of the present disclosure, the electrical field near the buried conductive layer 401 may be reduced by employing the in-recess spacer 301. Therefore, the gate-induced drain leakage may be reduced due to the electrical field reduction. As a result, the performance of the semiconductor device 1A may be improved.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, and steps.

What is claimed is:

1. A semiconductor device, comprising:
   a substrate;
   a plurality of word line structures positioned in the substrate;
   a buried conductive layer comprising:
      a bottom portion positioned in the substrate and between the plurality of word line structures; and a top portion positioned in the substrate, on the bottom portion, and between the plurality of word line structures; and an in-recess spacer positioned in the substrate, between the plurality of word line structures, surrounding the bottom portion, and covered by the top portion;

wherein a top surface of the top portion, a top surface of the substrate, and top surfaces of the plurality of word line structures are substantially coplanar;

wherein a bottom surface of the in-recess spacer and a bottom surface of the bottom portion are substantially coplanar;

wherein a sidewall of the in-recess spacer and a sidewall of the top portion are substantially coplanar.

2. The semiconductor device of claim 1, wherein the plurality of word line structures respectively comprises:

a word line dielectric layer inwardly positioned in the substrate and comprising a U-shaped cross-sectional profile;

a bottom conductive layer positioned in the substrate and on the word line dielectric layer; and a word line capping layer positioned in the substrate and on the word line dielectric layer and the bottom conductive layer;

wherein a bottom surface of the word line capping layer is at a vertical level lower than the bottom surface of the bottom portion.

3. The semiconductor device of claim 2, wherein the plurality of word line structures respectively comprises:

a middle conductive layer positioned between the bottom conductive layer and the word line capping layer.

4. The semiconductor device of claim 3, wherein the plurality of word line structures respectively comprises:

a bottom liner layer positioned between the bottom conductive layer and the middle conductive layer and between the middle conductive layer and the word line dielectric layer.

5. The semiconductor device of claim 4, wherein the plurality of word line structures respectively comprises:

a top conductive layer positioned between the word line capping layer and the middle conductive layer.

6. The semiconductor device of claim 5, wherein the plurality of word line structures respectively comprises:

a top liner layer positioned between the middle conductive layer and the top conductive layer and between the top conductive layer and the word line dielectric layer.

7. The semiconductor device of claim 6, wherein the bottom liner layer and the top liner layer comprise a material including $sp^2$ hybridized carbon atoms.

8. The semiconductor device of claim 7, wherein the word line capping layer comprises silicon oxide, silicon nitride, silicon oxynitride, silicon nitride oxide, or germanium oxide.

9. The semiconductor device of claim 8, wherein the word line dielectric layer comprises a high-k material.

10. The semiconductor device of claim 9, wherein the bottom conductive layer comprises titanium, titanium nitride, silicon, silicon germanium, or a combination thereof.

11. The semiconductor device of claim 10, wherein the middle conductive layer comprises tungsten, tungsten nitride, or a combination thereof.

12. The semiconductor device of claim 11, wherein the top conductive layer comprises molybdenum.

13. The semiconductor device of claim 12, wherein a width ratio of a width of the bottom surface of the bottom portion to a width of the top surface of the top portion is between about 0.5 and about 0.95.

14. The semiconductor device of claim 12, wherein a ratio of a thickness of the in-recess spacer to a width of the top surface of the top portion is between about 0.025 and about 0.25.

15. The semiconductor device of claim 12, wherein a height ratio of a height of the in-recess spacer to a height of the buried conductive layer is between about 0.5 and about 0.85.

16. The semiconductor device of claim 12, wherein the in-recess spacer has a square ring-shaped cross-sectional profile in a top-view perspective.

17. The semiconductor device of claim 12, wherein the buried conductive layer has a square-shaped cross-sectional profile in a top-view perspective.

18. The semiconductor device of claim 12, wherein the bottom liner layer and the top liner layer comprise the same material.

* * * * *